United States Patent
Mizushino et al.

(10) Patent No.: US 7,923,755 B2
(45) Date of Patent: Apr. 12, 2011

(54) SEMICONDUCTOR INTEGRATED CIRCUIT AND METHOD OF DESIGNING SEMICONDUCTOR INTEGRATED CIRCUIT

(75) Inventors: Emi Mizushino, Kyoto (JP); Hidetoshi Nishimura, Osaka (JP); Junichi Yano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/857,138

(22) Filed: Aug. 16, 2010

(65) Prior Publication Data

US 2010/0308905 A1    Dec. 9, 2010

Related U.S. Application Data

(62) Division of application No. 11/712,469, filed on Mar. 1, 2007, now Pat. No. 7,800,151.

(30) Foreign Application Priority Data

Mar. 1, 2006 (JP) .................................. 2006-054595

(51) Int. Cl.
*H01L 27/118* (2006.01)
*H03K 19/00* (2006.01)

(52) U.S. Cl. .......... 257/200; 257/204; 257/208; 326/47; 326/101

(58) Field of Classification Search .................... 257/72, 257/204, 206–207, 297, 300, 307; 326/47, 326/101; 327/530, 541
See application file for complete search history.

(56) References Cited

U.S. PATENT DOCUMENTS

| | | | |
|---|---|---|---|
| 4,868,903 A | 9/1989 | Corbett | |
| 6,604,226 B2 | 8/2003 | Thorp et al. | |
| 6,628,138 B2 | 9/2003 | Bobba et al. | |
| 6,629,306 B2 | 9/2003 | Bobba et al. | |
| 6,653,857 B2 | 11/2003 | Bobba et al. | |
| 6,818,929 B2 | 11/2004 | Tsutsumi et al. | |
| 7,342,434 B2 | 3/2008 | Wakayama et al. | |
| 7,358,555 B2 | 4/2008 | Iwamatsu et al. | |
| 7,417,870 B2 | 8/2008 | Lim et al. | |
| 7,786,585 B2 * | 8/2010 | Funakoshi et al. | ............ 257/758 |

* cited by examiner

*Primary Examiner* — Vibol Tan
(74) *Attorney, Agent, or Firm* — McDermott Will & Emery LLP

(57) ABSTRACT

In the present invention, a decoupling capacitance circuit, a first output terminal and a second output terminal are provided. The decoupling capacitance circuit comprises a TDDB control circuit consisting of a first Tr and a second Tr, and a third Tr. Conductivity types of the first and second Trs are different from each other. A source of the first Tr is connected to a first power supply wiring, and a drain of the first Tr is connected to a gate of the second Tr. A source of the second Tr is connected to a second power supply wiring, and a drain of the second Tr is connected to a gate of the first Tr. The third and first Trs have the same conductivity type. A source and a drain of the third Tr are connected to the first power supply wiring, and a gate of the third Tr is connected to the drain of the second Tr. The first output terminal is connected to the drain of the first Tr, and the second output terminal is connected to the drain of the second Tr.

4 Claims, 13 Drawing Sheets

F I G. 2
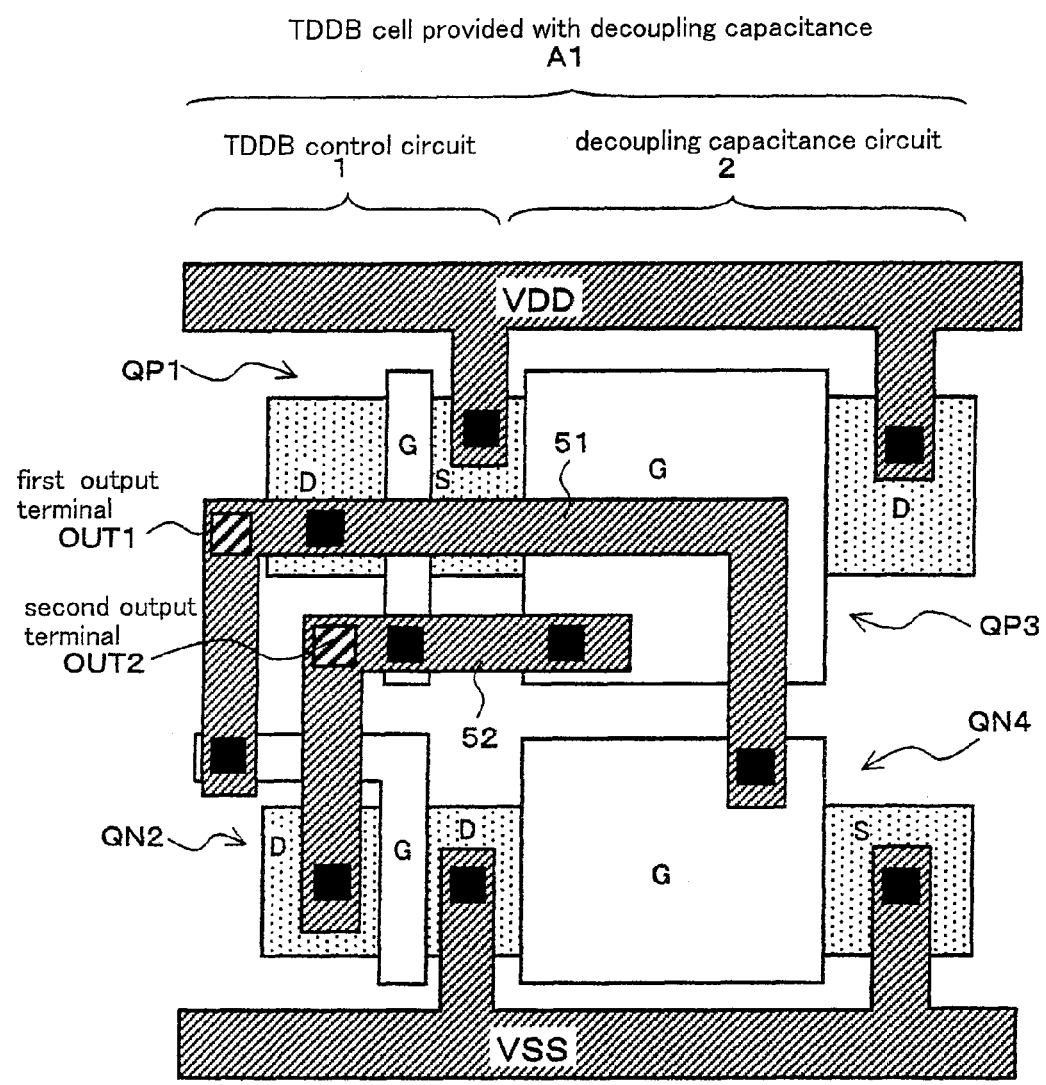

F I G. 6
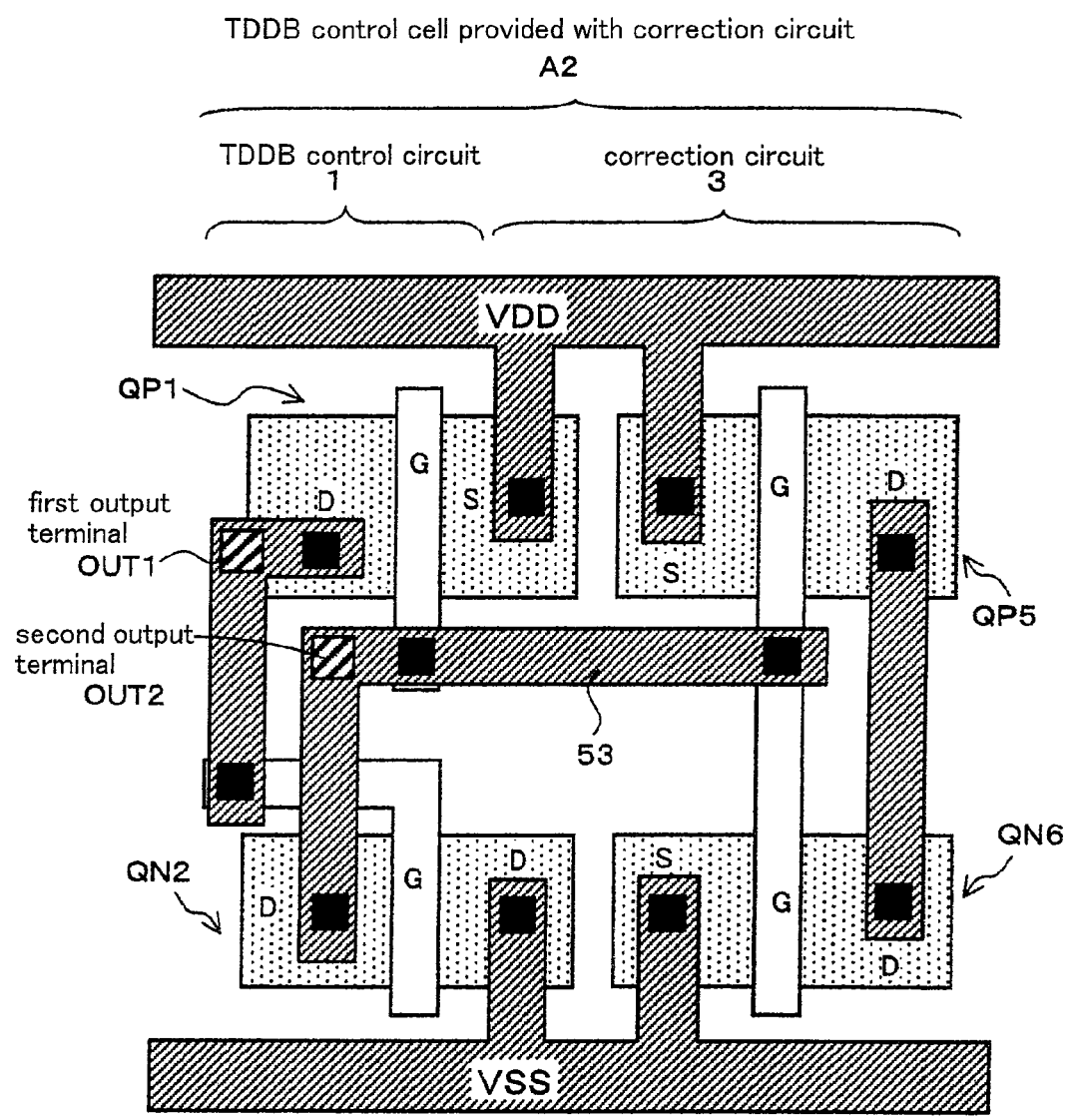

F I G. 7
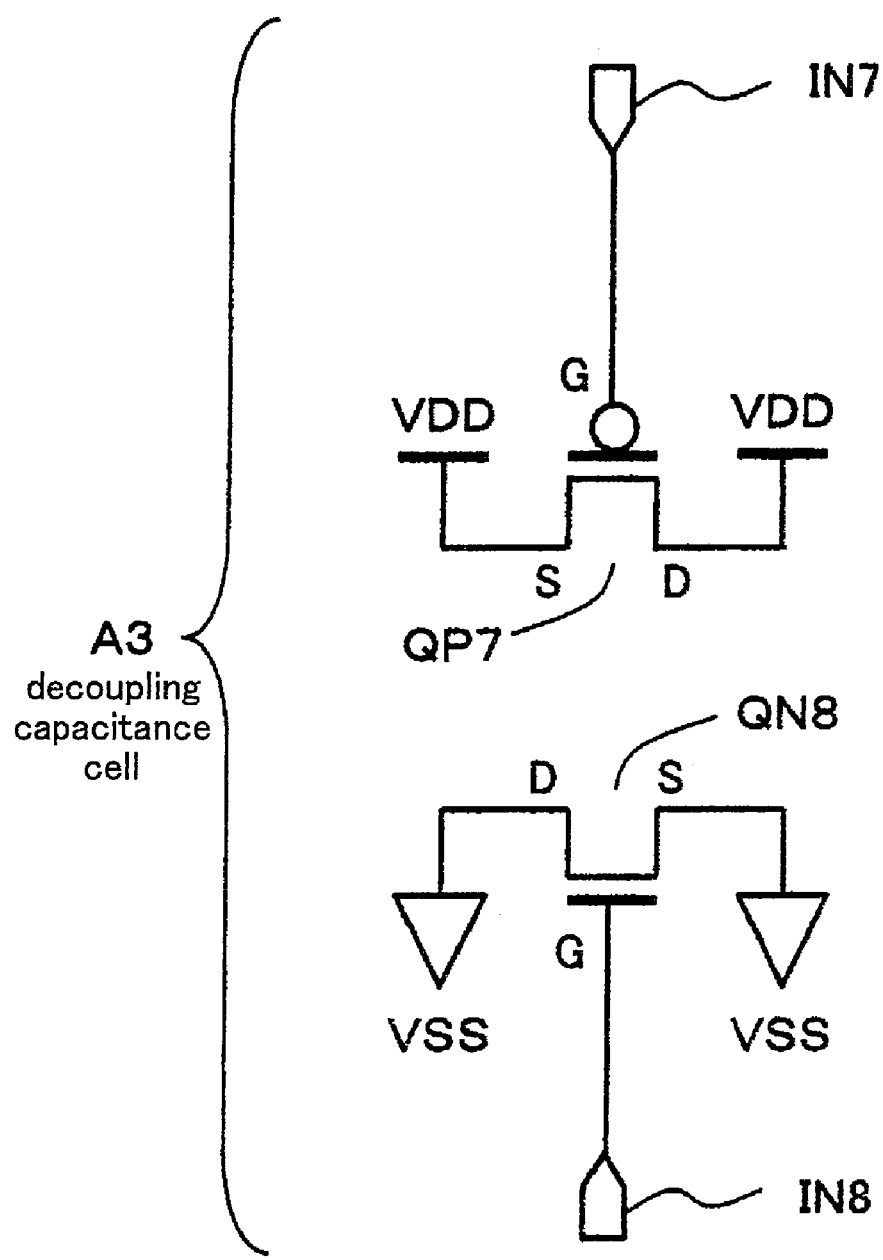

F I G. 8
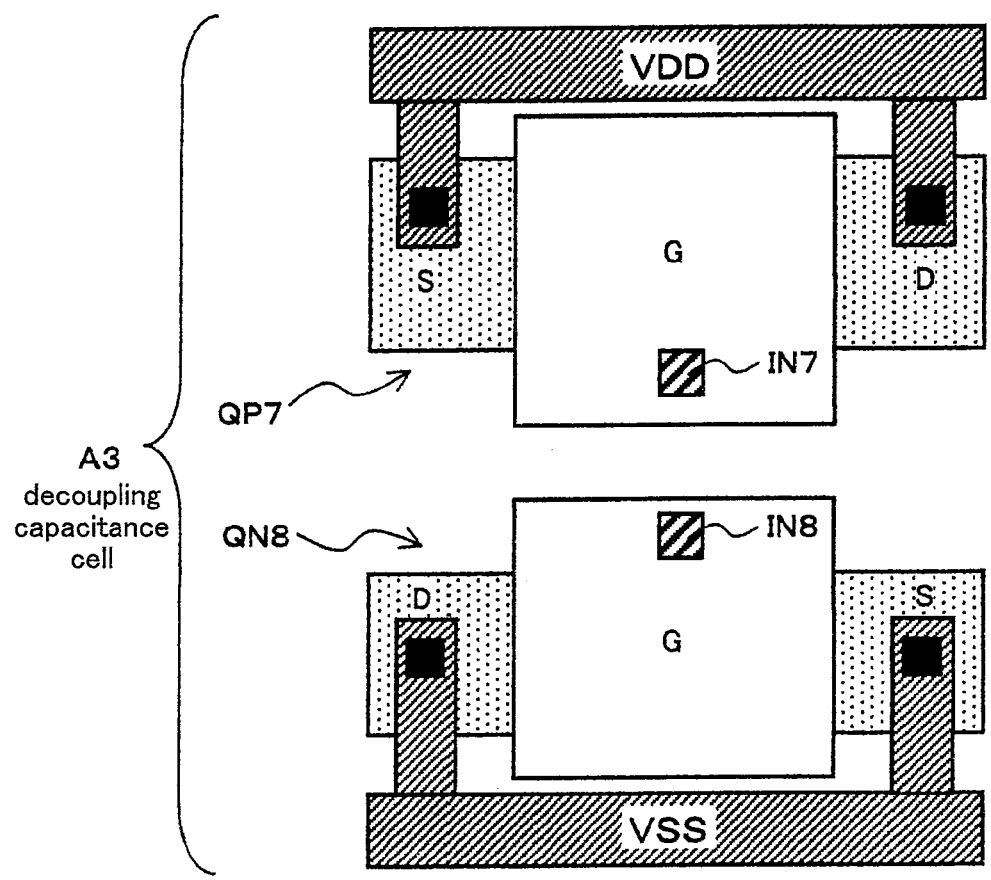

SEMICONDUCTOR INTEGRATED CIRCUIT AND METHOD OF DESIGNING SEMICONDUCTOR INTEGRATED CIRCUIT

RELATED APPLICATIONS

This application is a Divisional of U.S. patent application Ser. No. 11/712,469, filed on Mar. 1, 2007, now U.S. Pat. No. 7,800,151, claiming priority of Japanese Patent Application No. 2006-054595, filed on Mar. 1, 2006, the entire contents of each of which are hereby incorporated by reference.

BACKGROUND OF THE INVENTION

1. Field of the Invention

The present invention relates to a semiconductor integrated circuit and a method of designing the semiconductor integrated circuit for a purpose of protecting a gate oxide film of a transistor.

2. Description of the Related Art

In recent years, miniaturization of constituent elements in a semiconductor integrated circuit has been largely advanced. Above all, film thinning has been remarkably progressed in a gate oxide film in an MOS (Metal Oxide Semiconductor) transistor. However, thinning of the gate oxide film leads to reduction of a withstanding voltage of the gate oxide film and may cause the time dependent dielectric breakdown (TDDB) when a voltage is applied. Therefore, caution for the time dependent dielectric breakdown (TDDB) should be needed with respect to a circuit where a power supply voltage is constantly applied to a gate. Examples of such a circuit are a decoupling capacitance cell, a correction cell and the like.

The decoupling capacitance cell is provided in order to control variations of the power supply voltage that have become distinguished based on a large scale and high speed of SOC (system on a chip). In the decoupling capacitance, an MOS transistor of P-channel type or N-channel type is provided, and then a drain and a source thereof are connected to a high-voltage power supply wiring or a low-voltage power supply wiring so that a voltage of a reverse polarity is applied to a gate thereof.

A correction cell is the cell used in the case where an operation defect and addition of a function are generated after cell alignment wiring is implemented in a logical block. When the correction cell is not being used, a gate thereof is fixed to the power supply voltage or ground voltage in order to avoid increase of malfunction and power consumption due to a gate floating.

FIG. 11 is a circuit diagram of a TDDB control cell A1' provided with a decoupling capacitance that is an example of a conventional semiconductor integrated circuit. FIG. 12 is a layout plan view of the TDDB control cell A1'. The TDDB control cell A1 solves the foregoing problem (TDDB) through including the circuit recited in U.S. Pat. No. 4,868,903.

The TDDB control cell A1' comprises a TDDB control circuit 1 and a decoupling capacitance circuit 2 connected to the TDDB control circuit 1. The TDDB control circuit 1 includes a first transistor QP1 of P-channel type and a second transistor QN2 of N-channel type wherein a gate of the first transistor QP1 is connected to a drain of the second transistor QN2, and a drain of the first transistor QP1 is connected to a gate of the second transistor QN2.

The decoupling capacitance circuit 2 includes a third transistor QP3 of the P-channel type and a fourth transistor QN4 of the N-channel type wherein a source and a drain of the third transistor QP3 are connected to the high-voltage power supply wiring (VDD), and a drain and a source of the fourth transistor QN4 are connected to the low-voltage power supply wiring. A gate of the third transistor QP3 is connected to the drain of the second transistor QN2 through a wiring 52, and a gate of the fourth transistor QN4 is connected to the drain of the first transistor QP1 through a wiring 51. The power supply voltage (VDD/VSS) is constantly applied to the gates of the third transistor QP3 and the fourth transistor QN4.

Through providing the TDDB control circuit 1, the TDDB deterioration, that has the potential of generating in the decoupling capacitance circuit 2 where the power supply voltage is constantly applied to the gate, can be prevented.

However, the conventional semiconductor integrated circuit provided with the TDDB control circuit in the decoupling capacitance circuit that requires the protection of a gate insulating film is in a complete form itself. In other words, the conventional semiconductor circuit is provided independently under irrelevant state from the cells such as the other decoupling capacitance cell, correction cell and the like provided in a chip wherein prevention of the TDDB deterioration is requested. As a result, it becomes necessary to add the TDDB control circuit individually in each of the cells where prevention of the TDDB deterioration is requested, which is an unfavorable factor for increase of a chip area.

SUMMARY OF THE INVENTION

Therefore, a main object of the present invention is to make prevention of TDDB deterioration prevent possible in as many cells as possible while controlling increase of a chip area.

In order to solve the foregoing problem, a semiconductor integrated circuit according to the present invention comprises:

a decoupling capacitance circuit; a first output terminal; a second output terminal; a first power supply wiring; and a second power supply wiring, wherein the decoupling capacitance circuit includes:

a TDDB control circuit provided with a first transistor and a second transistor; and a third transistor, wherein conductivity types of the first and second transistors are different from each other, a source of the first transistor is connected to the first power supply wiring, and a drain of the first transistor is connected to a gate of the second transistor, a source of the second transistor is connected to the second power supply wiring, and a drain of the second transistor is connected to a gate of the first transistor, a conductivity type of the third transistor is the same as that of the first transistor, a source and a drain of the third transistor are connected to the first power supply wiring, and a gate of the third transistor is connected to the drain of the second transistor, the first output terminal is connected to the drain of the first transistor, and the second output terminal is connected to the drain of the second transistor.

The conductivity type here refers to P-channel type or N-channel type of the semiconductor. Furthermore, there is an embodiment that, in the foregoing constitution, the first and third transistors are of the P-channel type, the second transistor is of the N-channel type, the first power supply wiring is a high-voltage power supply wiring, and the second power supply wiring is a low-voltage power supply wiring.

A semiconductor integrated circuit according to the present invention comprises:

a TDDB control circuit; a decoupling capacitance circuit; a first power supply wiring; a second power supply wiring; a first output terminal; and a second output terminal, wherein the TDDB control circuit comprises a first transistor and a second transistor having conductivity types different from each other, a source of the first transistor is connected to the first power supply wiring, and a drain of the first transistor is connected to a gate of the second transistor, a source of the second transistor is connected to the second power supply wiring, and a drain of the second transistor is connected to a gate of the first transistor, the decoupling capacitance circuit comprises a third transistor having the same conductivity type as that of the second transistor, a source and a drain of the third transistor are connected to the second power supply wiring, and a gate of the third transistor is connected to the drain of the first transistor, the first output terminal is connected to the drain of the first transistor, and the second output terminal is connected to the drain of the second transistor.

In addition, there is an embodiment that, in the foregoing constitution, the first transistor is of the P-channel type, the second and third transistors are of the N-channel type, the first power supply wiring is a high-voltage power supply wiring, and the second power supply wiring is a low-voltage power supply wiring.

Additionally, a semiconductor integrated circuit according to the present invention comprises:

a TDDB control circuit; a decoupling capacitance circuit; a first power supply wiring; a second power supply wiring; a first output terminal; and a second output terminal, wherein the TDDB control circuit comprises a first transistor and a second transistor having conductivity types different from each other, a source of the first transistor is connected to the first power supply wiring, the source of the second transistor is connected to the second power supply wiring, and a drain of the first transistor is connected to a gate of the second transistor, a drain of the second transistor is connected to a gate of the first transistor, the decoupling capacitance circuit comprises a third transistor having the same conductivity type as that of the first transistor and a fourth transistor having the same conductivity type as that of the second transistor, a source and a drain of the third transistor are connected to the first power supply wiring, and a gate of the third transistor is connected to the drain of the second transistor, a source and a drain of the fourth transistor are connected to the second power supply wiring, and a gate of the fourth transistor is connected to the drain of the first transistor, the first output terminal is connected to the drain of the first transistor, and the second output terminal is connected to the drain of the second transistor.

As well, there is an embodiment that, in the foregoing constitution, the first and third transistors are of the P-channel type, the second and fourth transistors are of the N-channel type, the first power supply wiring is a high-voltage power supply wiring, and the second power supply wiring is a low-voltage power supply wiring.

The aforementioned semiconductor integrated circuit is similar to the conventional semiconductor integrated circuit in a point that the TDDB control circuit and the decoupling capacitance circuit are provided. However, because the first and second output terminal are provided in the TDDB control circuit, it becomes unnecessary to equip with the TDDB control circuit in each of all cells by connecting the first and second terminal to the gate of other cells in the case where there are other cells, in which prevention of the TDDB deterioration is requested, such as the decoupling capacitance cell and a correction cell to which the power supply voltage is constantly applied. More specifically, the semiconductor integrated circuit can be shared by the plurality of cells wherein prevention of the TDDB deterioration is requested. As a result, the TDDB deterioration preventing function can be developed in as many cells as possible while controlling increase of the chip area.

A semiconductor integrated circuit according to the present invention comprises:

a TDDB control circuit; a correction circuit for correcting an operation defect or adding a function; a first power supply wiring; a second power supply wiring; a first output terminal; and a second output terminal, wherein the TDDB control circuit comprises a first transistor and a second transistor having conductivity types different from each other, a source of the first transistor is connected to the first power supply wiring, and a drain of the first transistor is connected to a gate of the second transistor, a source of the second transistor is connected to the second power supply wiring, and a drain of the second transistor is connected to a gate of the first transistor, the correction circuit comprises at least one of third transistor, and a power supply voltage or a ground voltage is fixedly applied to a gate of the third transistor when the third transistor is not being used, the drain of the first transistor or the drain of the second transistor is connected to the gate of the third transistor, the first output terminal is connected to the drain of the first transistor, and the second output terminal is connected to the drain of the second transistor.

In the aforementioned semiconductor integrated circuit, the TDDB control circuit comprises the first and second output terminals. Therefore, in the case where there are other cells, wherein prevention of the TDDB deterioration is requested, such as the decoupling capacitance cell and the correction cell where the power supply voltage is constantly applied to the gate thereof, the first and second output terminals are connected to the gates of the other cells so that it becomes unnecessary to provide the TDDB control circuit individually in all of the cells wherein prevention of the TDDB deterioration is requested. More specifically, the semiconductor integrated circuit can be shared by the plurality of cells wherein prevention of the TDDB deterioration is requested. As a result, a function for preventing the TDDB deterioration can be developed in as many cells as possible while preventing increase of the chip area.

In the respective semiconductor integrated circuits described above, there is an embodiment that the first power supply wiring is a high-voltage power supply wiring, and a decoupling capacitance cell and an input terminal are further provided, wherein the decoupling capacitance cell comprises a transistor of the P-channel type, a source and a drain of the transistor of the P-channel type are connected to the first power supply wiring, and a gate of the transistor of the P-channel type is connected to the input terminal, and the input terminal is connected to the second output terminal through an inter-cell wiring.

Additionally, in the respective semiconductor integrated circuits described above, there is an embodiment that the second power supply wiring is a low-voltage power supply wiring, and a decoupling capacitance cell and an input terminal are further provided, wherein the decoupling capacitance cell comprises a transistor of the N-channel type, a source and a drain of the transistor of the N-channel type are connected to the second power supply wiring, and a gate of the transistor of the N-channel type is connected to the input terminal, and the input terminal is connected to the first output terminal through an inter-cell wiring.

Furthermore, in the respective semiconductor integrated circuits, there is an embodiment that the first power supply wiring is a high-voltage power supply wiring, and the second power supply wiring is a low-voltage power supply wiring, and the semiconductor integrated circuit further comprises a decoupling capacitance cell, a first input terminal and a second input terminal, wherein the decoupling capacitance cell comprises a transistor of the P-channel type and a transistor of the N-channel type, a source and a drain of the transistor of the P-channel type are connected to the first power supply wiring, and a gate of the transistor of the P-channel type is connected to the first input terminal, a source and a drain of the transistor of the N-channel type are connected to the second power supply wiring, and a gate of the transistor of the N-channel type is connected to the second input terminal the first input terminal is connected to the second output terminal through an inter-cell wiring, and the second input terminal is connected to the first output terminal through an inter-cell wiring.

In the constitutions according to the foregoing embodiment, variations of the power supply are further controlled so that a stable operation can be obtained as an effect derived from them.

A method of designing a semiconductor integrated circuit according to the present invention comprises:

a step of arranging logical cells for realizing a function in a logical block;

a step of arranging a correction cell for correcting an operation defect and adding a function;

a step of arranging a TDDB control cell comprising a decoupling capacitance circuit or a correction circuit and consisting of a plurality of output terminals in a blank region of the logical block;

a step of wiring the arranged logical cells to each other; and a step of wiring the TDDB control cell and the correction cell to each other.

In the foregoing designing method, the TDDB control cells are arranged before the step of wiring the logical cells, and the wirings for the logical cells are prioritized over the wiring between the TDDB control cell and the correction cell. Accordingly, the wirings that connect the logical cells can be prevented from being redundantly bypassed due to the presence of the wiring that connects the TDDB cell and the correction cell. As a result, a wiring efficiency between the logical cells can be improved, and any influence from a wiring delay can be controlled to minimum.

A method of designing a semiconductor integrated circuit according to the present invention comprises:

a step of arranging logical cells for realizing a function in a logical block;

a step of arranging a correction cell for correcting an operation defect and adding a function;

a step of arranging a TDDB control cell including a decoupling capacitance cell or a correction circuit and comprising a plurality of output terminals in a blank region of the logical block;

a step of temporarily wiring the logical cells to each other;

a step of temporarily wiring the TDDB control cell and the correction cell to each other;

a step of estimating a wiring congestion degree based on a result of the temporary wirings;

a step of deciding arrangement number of the decoupling capacitance cells and the correction cells in accordance with the estimated wiring congestion degree;

a step of wiring the arranged logical cells to each other in a detailed manner;

a step of wiring the TDDB control cell and the correction cell to each other in a detailed manner.

According to the foregoing constitution, the semiconductor integrated circuit can be effectively designed in view of the wiring congestion degree irrespective of the presence of the TDDB control cell.

According to the present invention, it becomes unnecessary to provide the TDDB control circuit in each of the cells where prevention of the TDDB deterioration is requested. As a result, the function for preventing the TDDB deterioration can be developed in as many cells as possible while repressing increase of the chip area.

The technology according to the present invention is useful for a large-scale semiconductor integrated circuit in which a large number of capacitance cells and correction cells are used because the TDDB control cell provided for protecting the gate oxide film can be shared in order to eliminate redundant usage, so that it becomes possible to control the increase of the chip area.

BRIEF DESCRIPTION OF THE DRAWINGS

These and other objects as well as advantages of the invention will become clear by the following description of preferred embodiments of the invention. A number of benefits not recited in this specification will come to the attention of those skilled in the art upon the implementation of the present invention.

FIG. 2 is a layout plan view of the TDDB control cell according to the preferred embodiment 1.

FIG. 6 is a layout plan view of the TDDB control cell according to the preferred embodiment 2.

FIG. 7 is a circuit diagram illustrating a decoupling capacitance cell as a semiconductor integrated circuit according to a preferred embodiment 3 of the present invention.

FIG. 8 is a layout plan view of the decoupling capacitance cell according to the preferred embodiment 3.

DETAILED DESCRIPTION OF THE INVENTION

Figure 1:
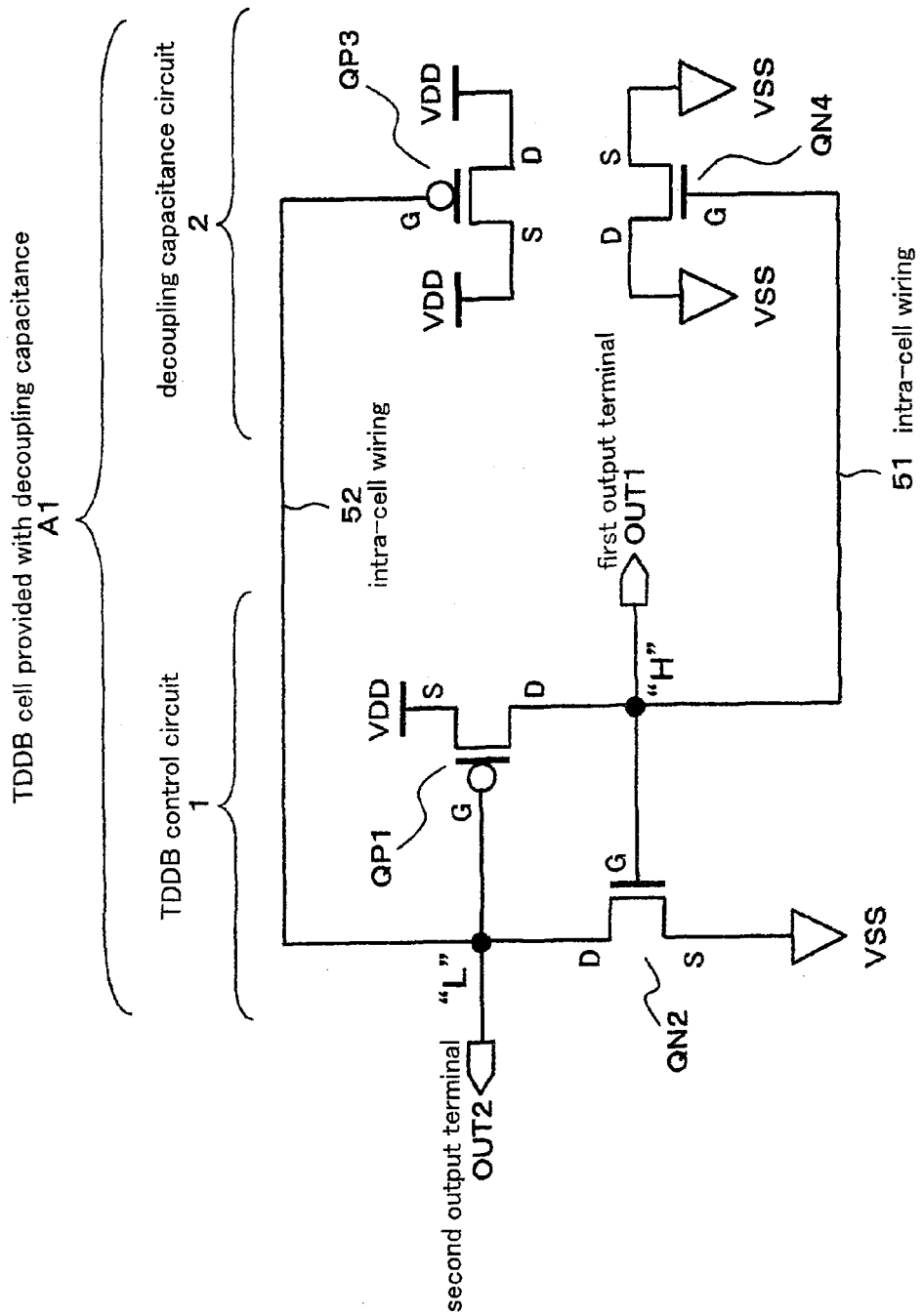
FIG. 1 is a circuit diagram showing a TDDB control cell provided with a decoupling capacitance as a semiconductor integrated circuit according to a preferred embodiment 1 of the present invention.

Hereinafter, preferred embodiments of the present invention are described referring to the drawings.

Preferred Embodiment 1

FIG. 1 is a circuit diagram illustrating a TDDB control cell A1 provided with a decoupling capacitance as a semiconductor integrated circuit according to a preferred embodiment 1 of the present invention. FIG. 2 is a layout plan view of the TDDB control cell A1. The TDDB control cell A1 comprises a TDDB control circuit 1 and a decoupling capacitance circuit 2 connected to the TDDB control circuit 1.

The TDDB control circuit 1 includes a first transistor QP1 of P-channel type and a second transistor QN2 of N-channel type. A source of the first transistor QP1 is connected to a high-voltage power supply wiring (VDD). A source of the second transistor QN2 is connected to a low-voltage power supply wiring (VSS). A gate of the first transistor QP1 is connected to a drain of the second transistor QN2. A drain of the first transistor QP1 is connected to a gate of the second transistor QN2.

The decoupling capacitance circuit 2 comprises a third transistor QP3 of the P-channel type and a fourth transistor QN4 of the N-channel type. A source and a drain of the third transistor QP3 are connected to the high-voltage power supply wiring (VDD). A source and a drain of the fourth transistor QN4 are connected to the low-voltage power supply wiring (VSS). A gate of the third transistor QP3 is connected to the drain of the second transistor QN2. A gate of the fourth transistor QN4 is connected to the drain of the first transistor QP1. The gate of the third transistor QP3 is also connected to the gate of the first transistor QP1. The gate of the fourth transistor QN4 is also connected to the gate of the second transistor QN2. A first output terminal OUT1 is connected to the drain of the first transistor QP1 in the TDDB control circuit 1, and a second output terminal OUT2 is connected to the drain of the second transistor QN2.

Figure 11:
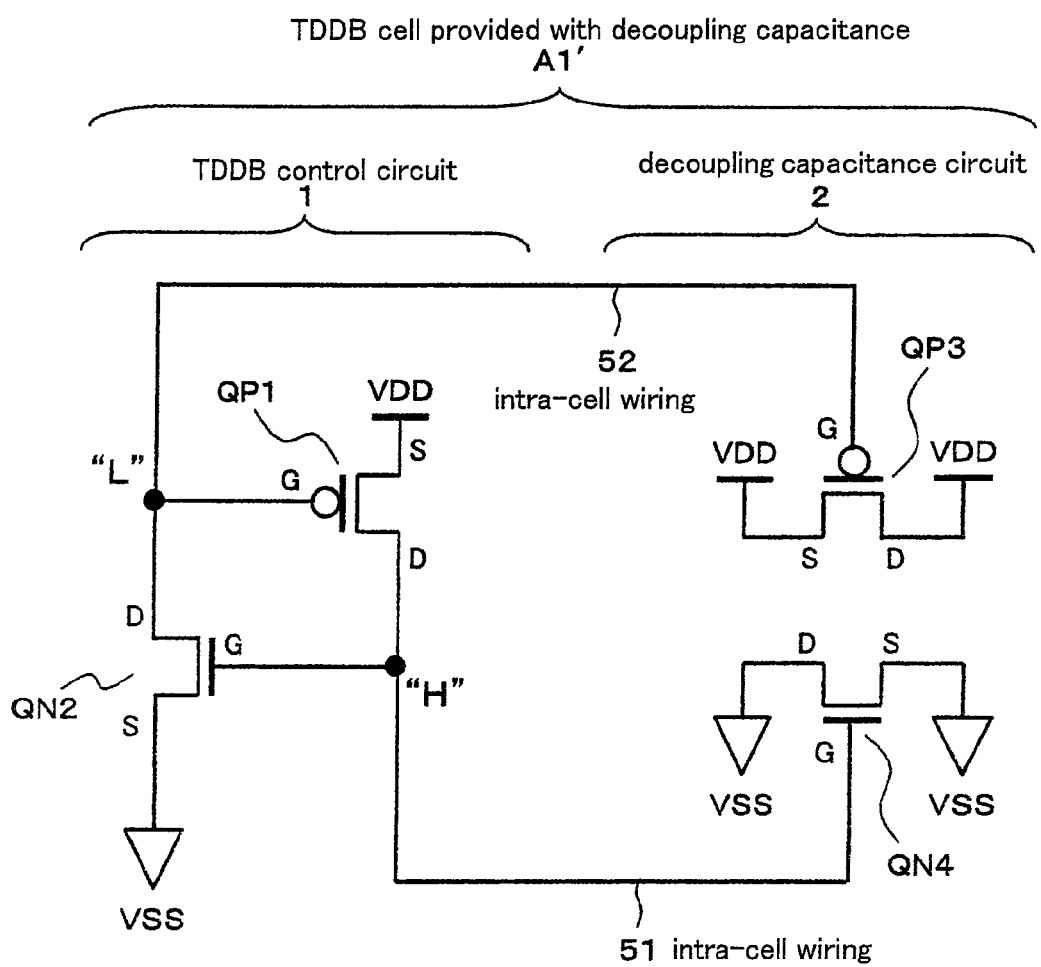
FIG. 11 is a circuit diagram illustrating a TDDB control cell provided with a decoupling capacitance as a semiconductor integrated circuit according to a conventional technology.
Figure 12:
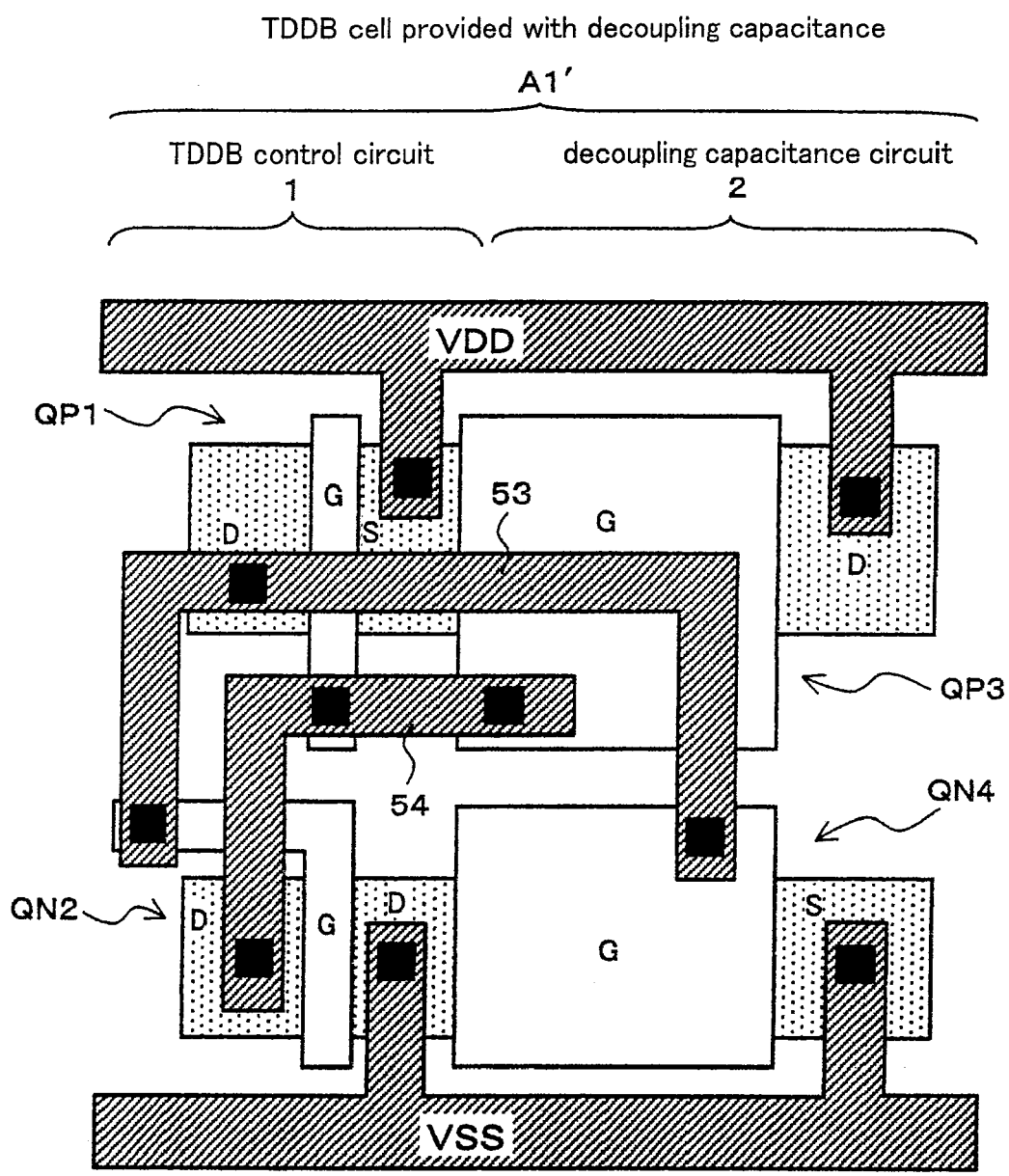
FIG. 12 is a layout plan view of the TDDB control cell according to the conventional technology.

As just described, the first and second output terminals OUT1 and OUT2 is added in the TDDB control circuit 1. The reference symbols shown in FIG. 2 correspond to those shown in FIG. 1. According to comparison to the conventional constitution (see FIGS. 11 and 12), the present preferred embodiment is characterized in that the first and second output terminals OUT1 and OUT2 are provided.

A reference numeral 51 denotes an intra-cell wiring that connects the drain of the first transistor QP1 and the gate of the fourth transistor QN4 to each other, and 52 denotes an intra-cell wiring that connects the drain of the second transistor QN2 and the gate of the third transistor QP3 to each other.

The decoupling capacitance circuit 2 may consist of the third transistor QP3 only or the fourth transistor QN4 only.

As described above, the TDDB control cell A1 can exert not only function to protect gate oxide films of the transistors in the decoupling capacitance circuit 2 with the TDDB control circuit 1, but also a function to protect gate oxide films of the other circuits through connecting to the other circuits that need the TDDB control by providing the first and second output terminals OUT 1 and OUT2.

Figure 3:
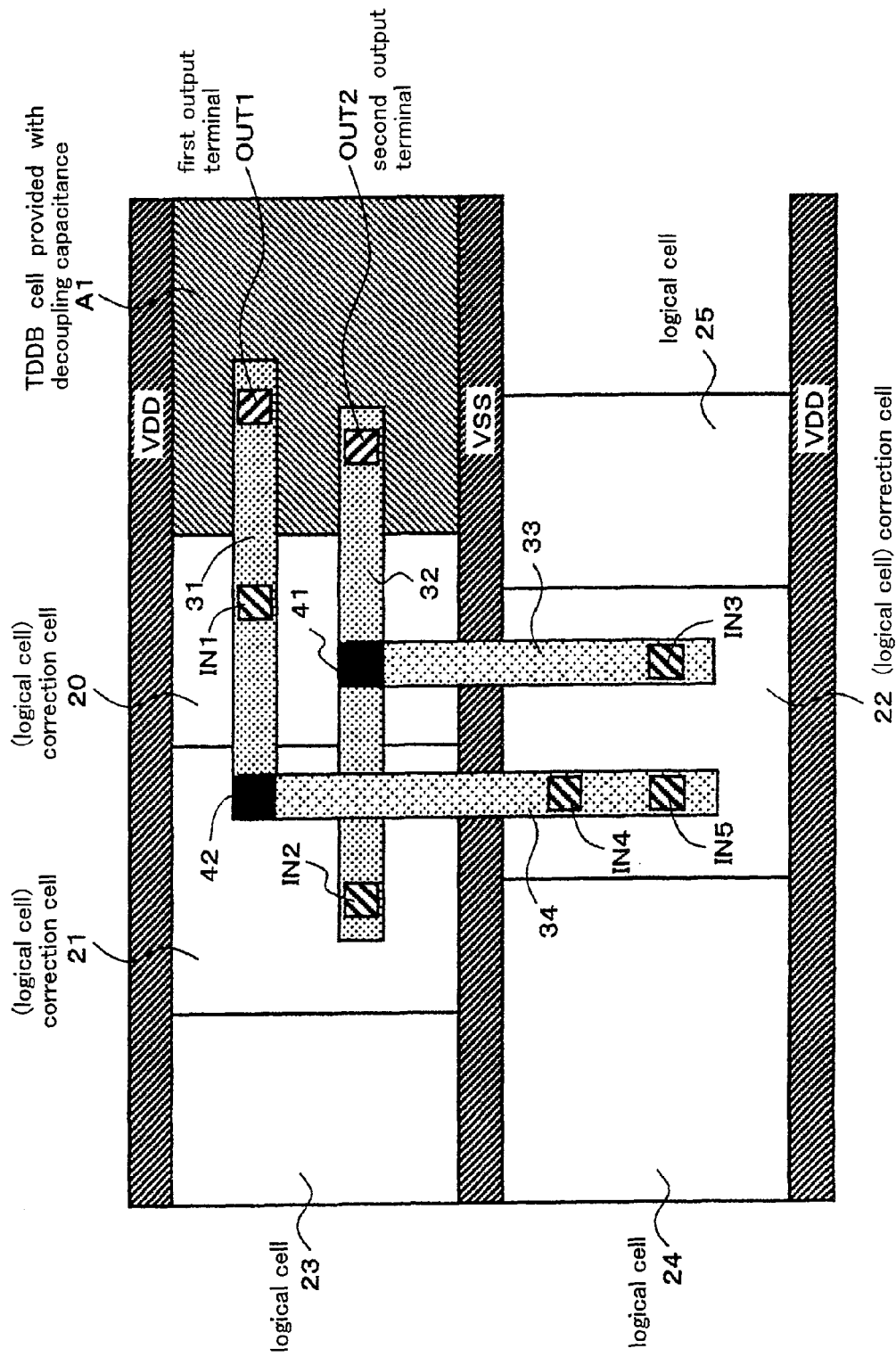
FIG. 3 is a layout plan view illustrating a part of a logical block including the TDDB control cell provided with the decoupling capacitance according to the preferred embodiment 1.

FIG. 3 is a layout plan view illustrating a part of a logical block including the TDDB control cell A1 provided with the decoupling capacitance. The logical cells 20-25 are arranged along cell rows extended horizontally by means of an automatic layout and wiring tool. In a blank region where the logical cells are not provided, the TDDB control cell A1 with the decoupling capacitance is similarly arranged. The logical cells include correction cells, and reference numerals 20, 21 and 22 denote the correction cells. The correction cell is a preliminary cell used when an operation defect is corrected and a function is added. When the correction cells are not being used, gates of the correction cells are fixed to a power supply voltage or a ground voltage in order to avoid increase of power consumption and malfunction due to a gate floating. At the time, it is necessary to control the TDDB in this gate.

The correction cells 20, 21 and 22 comprise at least one input terminal respectively. More specifically, the correction cell 20 has an input terminal IN1, the correction cell 21 has an input terminal IN2, and the correction cell 22 has input terminals IN3, IN4 and IN5. The input terminal IN1 of the correction cell 20 is connected to the first output terminal OUT1 through an inter-cell wiring 31. The input terminal IN2 of the correction cell 21 is connected to the second output terminal OUT2 through an inter-cell wiring 32. The input terminal IN3 of the correction cell 22 is connected to the second output terminal OUT2. The input terminal IN3 is connected to the second output terminal OUT2 through a via 41 provided at an intermediate position in the inter-cell wiring 32 and an inter-cell wiring 33 provided in a different wiring layer. The input terminals IN4 and IN5 of the correction cell 22 are connected to the first output terminal OUT1. The input terminals IN4 and IN5 are connected to the first output terminal OUT1 through a via 42 provided in the inter-cell wiring 31 and an inter-cell wiring 34 provided in a different wiring layer. Like this, the inter-cell wirings may be provided across the plurality of different wiring layers.

Because the correction cell 20 is arranged adjacently to the TDDB control cell A1, the wiring 31 which connects the input terminal IN1 and the first output terminal OUT1 to each other may not be necessarily the inter-cell wiring in the upper layer, and it may be connected through a metal wiring used in the cell.

According to the above constitution, the TDDB control cell A1 can protect the gates of the correction cells 20, 21 and 22 provided at the distant positions. As a result, the TDDB control circuit A1 is applicable as a gate protecting circuit for the plurality of correction cells. As a result, increase of a chip area can be prevented.

The first and second output terminals OUT1 and OUT2 of the TDDB control cell A1 not only can be connected to the input terminals of the correction cells, but also make an inter-cell wiring between the input terminals of the other logical cells. As a result, increase of a chip area can be prevented in a similar manner.

Figure 13:
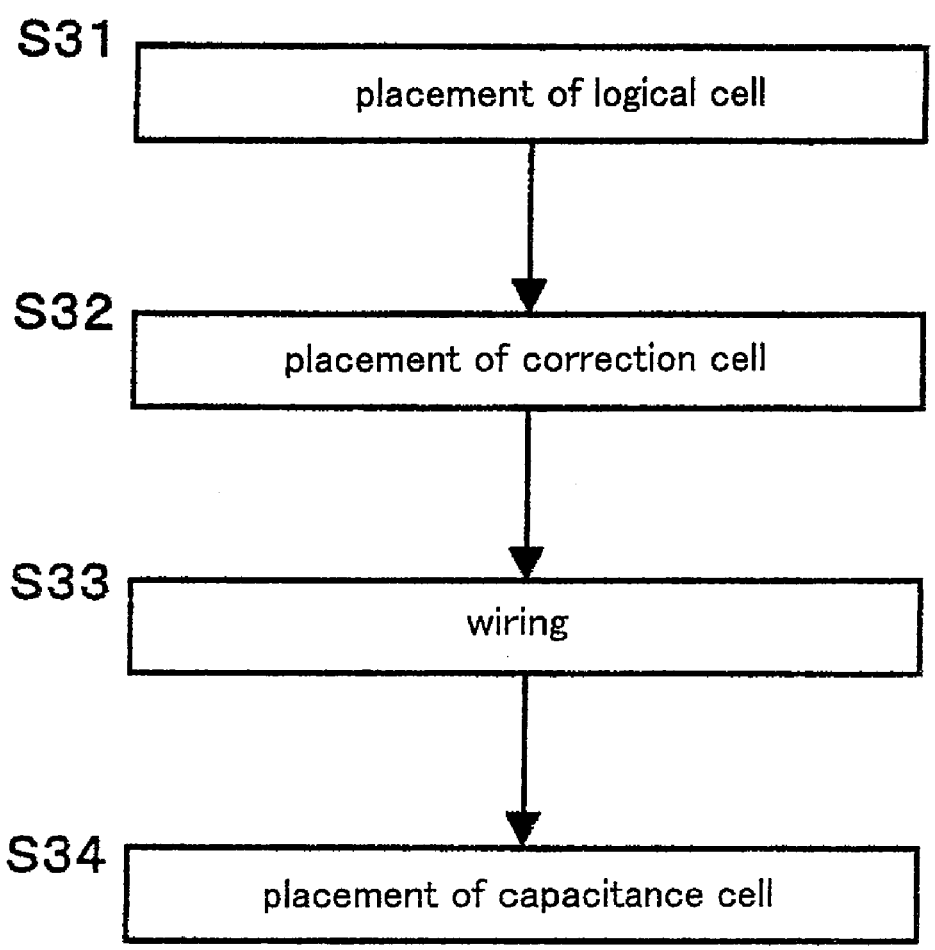
FIG. 13 is a flow chart illustrating procedures of a method for designing the semiconductor integrated circuit according to the conventional technology.

Next, a designing method is described in relation to the layout and wiring of the TDDB control cell A1 provided with the decoupling capacitance. In the conventional constitution, the logical cells for realizing the function and the correction cells for correcting the circuits were arranged through the wirings in the logical block, and after that the capacitance cell was provided in the blank region as shown in FIG. 13.

Figure 4:
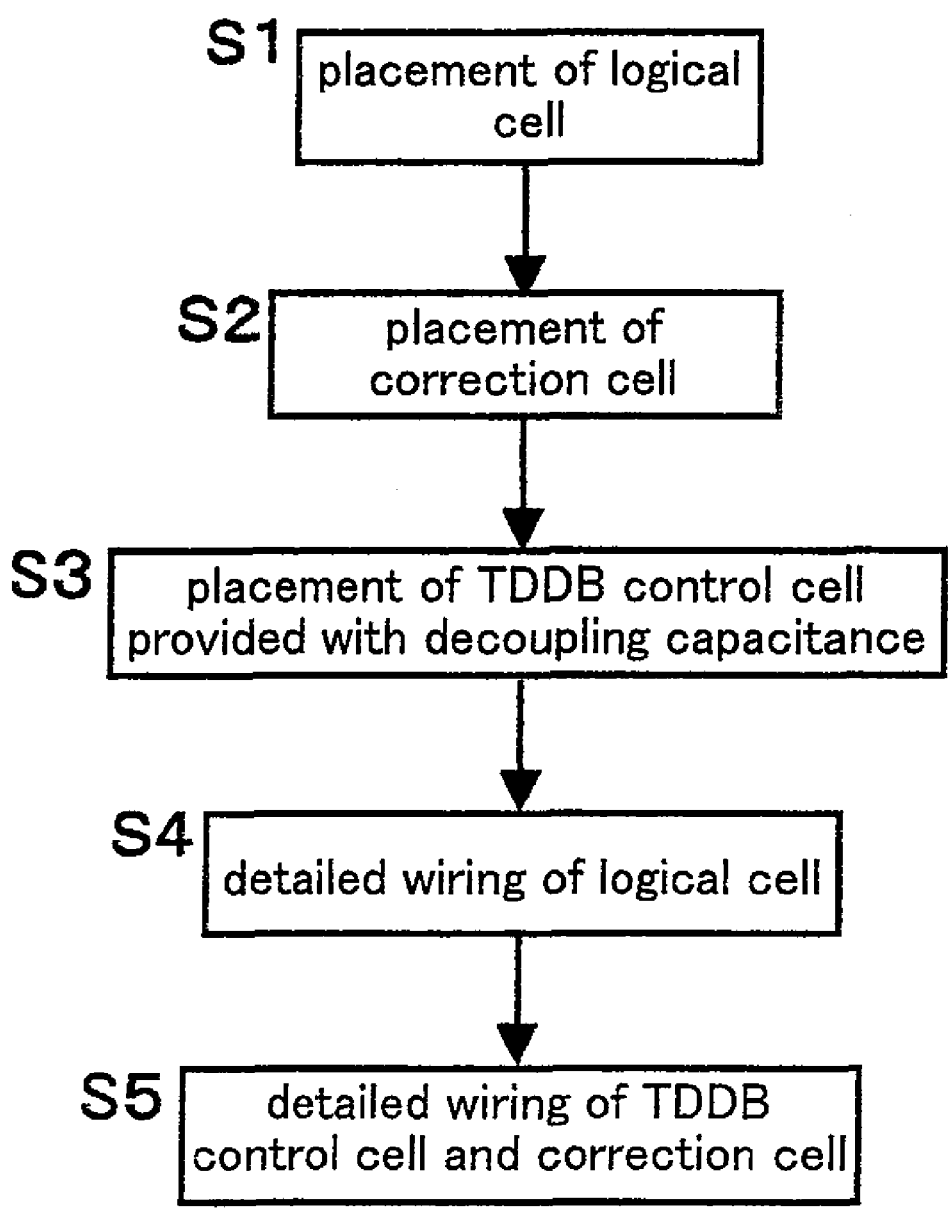
FIG. 4 is a flow chart illustrating steps of a method of designing the semiconductor integrated circuit according to the preferred embodiment 1.

In the present preferred embodiment, the designing is carried out according to the procedure shown in FIG. 4 because it is necessary to connect the output terminals of the TDDB control cell A1 and the input terminals of the correction cells 20, 21 and 22 through the inter-cell wirings.

In Step S1, the logical cells for realizing the function are arranged in the logical block. Next, the correction cells are arranged in Step S2. Then, the cell layout is completed by arranging the TDDB control cell A1 provided with the decoupling capacitance in the blank region of the logical block in Step S3.

Next, at the mention of the inter-cell wirings, first in Step S4, the wirings between the logical cells arranged in the Step S1 (detailed wirings) are carried out preferentially. In the case where it is not possible to provide the wirings depending on the positions of the logical cells, the rewiring is performed repeatedly in the local region including the part where the wirings are not possible until the wirings are completed.

In Step S5, wiring between the TDDB control circuit A1 and the correction cells (detailed wirings) are carried out. In the case where the wiring is impossible due to influences from the layout positions of the logical cells and a wiring congestion degree in the Step S4, the rewiring is performed repeatedly in the local region including the part where the wirings are not possible until the wirings are completed.

According to the designing method wherein the TDDB control cell A1 provided with the decoupling capacitance is arranged before the wiring process as described above, and the logical cells are wired preferentially to the corrections cells, a wiring efficiency between the logical cells can be improved. More specifically, the wirings connecting between the logical cells can be prevented from bypassing redundantly due to the presence of the wirings that connect the TDDB cell A1 and the correction cells. As a result, any influence from a wiring delay can be controlled to minimum.

Preferred Embodiment 2

Figure 5:
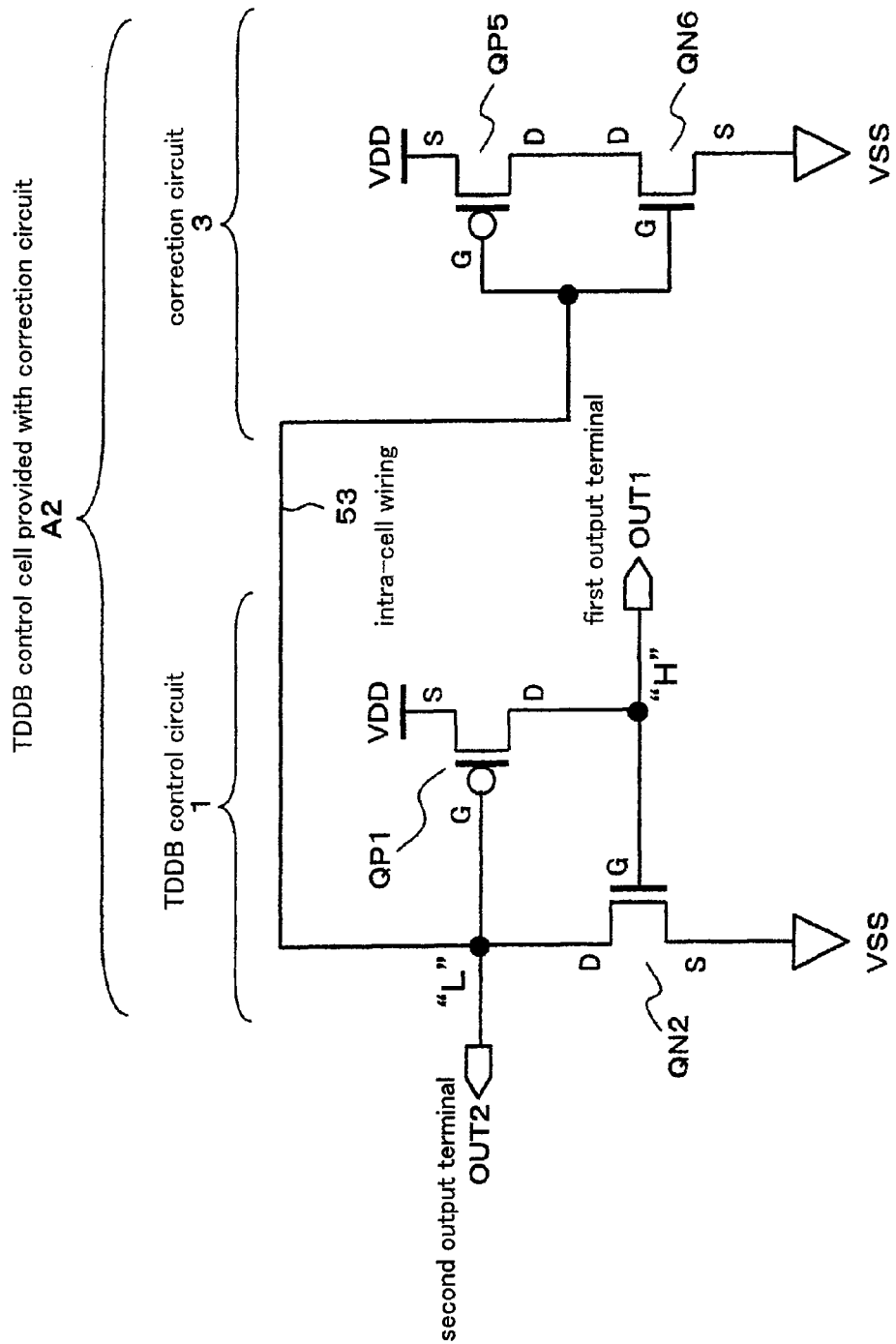
FIG. 5 is a circuit diagram illustrating a TDDB control cell provided with a correction circuit as a semiconductor integrated circuit according to a preferred embodiment 2 of the present invention.

FIG. 5 is a circuit diagram illustrating a TDDB control cell A2 provided with a correction circuit as a semiconductor integrated circuit according to a preferred embodiment 2 of the present invention. FIG. 6 is a layout plan view of the TDDB control cell A2.

The TDDB control cell A2 provided with the correction circuit according to the present preferred embodiment comprises a TDDB control circuit 1 and a correction circuit 3. The TDDB control circuit 1 is constituted in a manner similar to the preferred embodiment 1 and is not described again. The correction circuit 3 is a cell having the same role as that of the correction cells 20, 21 and 22 shown in FIG. 3 according to the preferred embodiment 1. An inverter comprising a fifth transistor QP5 of the P-channel type and a sixth transistor QN6 of the N-channel type, can be quoted as a constitutional example of the correction circuit 3. A source of the fifth transistor QP5 is connected to a high-voltage power supply wiring (VDD). A source of the sixth transistor QN6 is connected to a low-voltage power supply wiring (VSS). Drains of the transistors QP5 and QN6 are connected to each other. Gates of the transistors QP5 and QN6 are connected to a second output terminal Out2 through an intra-cell wiring 53. These gates may be connected to a first output terminal OUT1. Any other circuit may be adopted as the correction circuit 3 in place of the inverter. According to the above constitution, the chip area can be reduced effectively in a manner similar to the preferred embodiment 1.

Further, with respect to a designing method in relation to the layout and wiring of the TDDB control cell A2, it is similar to the procedure shown in FIG. 4 according to the preferred embodiment 1. However, Step S3 is different in a point that the TDDB control cell A1 is provided in place of the TDDB control cell A2.

Preferred Embodiment 3

FIG. 7 is a circuit diagram illustrating a decoupling capacitance cell A3 as a semiconductor integrated circuit according to a preferred embodiment 3 of the present invention. FIG. 8 is a layout plan view of the decoupling capacitance cell A3. The decoupling capacitance cell A3 comprises a transistor QP7 of the P-channel type and an eighth transistor QN8 of the N-channel type. A drain and a source of the transistor QP7 of the P-channel type are connected to a high-voltage power supply wiring (VDD). A drain and a source of the transistor QN8 of the N-channel type are connected to a low-voltage power supply wiring (VSS). An input terminal IN7 is connected to a gate of the transistor QP7 of the P-channel type. An input terminal IN8 is connected to a gate of the transistor QN8 of the N-channel type.

Figure 9:
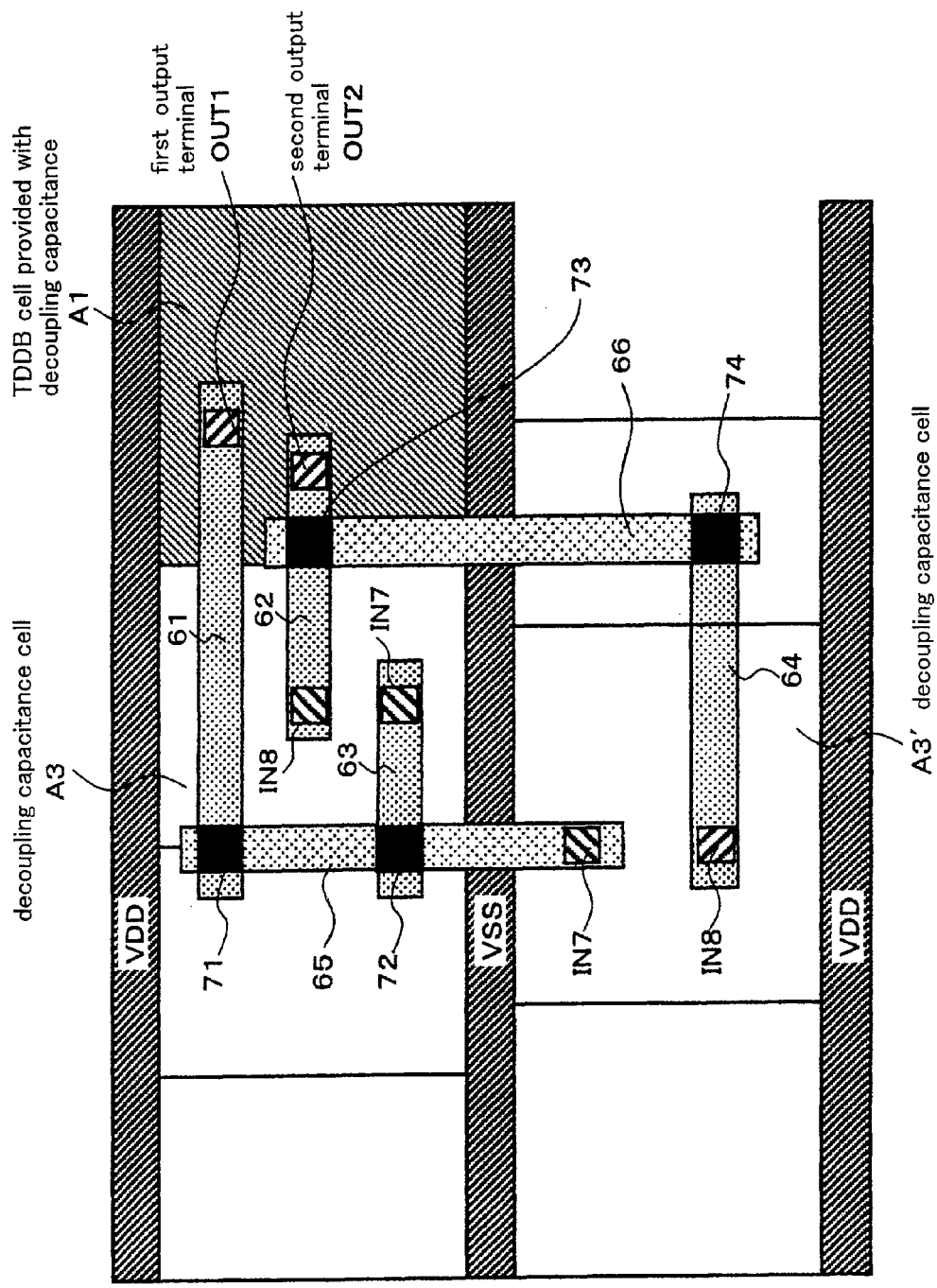
FIG. 9 is a layout plan view illustrating a part of a logical block including the decoupling capacitance cells according to the preferred embodiment 3 and the TDDB control cell provided with the decoupling capacitance.

FIG. 9 is a layout plan view illustrating a part of a logical block including decoupling capacitance cells A3 and A3' and the TDDB control cell A1 provided with the decoupling capacitance shown in FIG. 1 according to the preferred embodiment 1. The decoupling capacitance cells A3 and A3' have a same circuit configuration and have the input terminals IN7 and IN8 respectively. However, the decoupling capacitance cells A3 and A3' have different cell sizes and capacitance values.

The input terminal IN7 of the decoupling capacitance cell A3 is connected to the first output terminal OUT1 of the TDDB control cell A1. The input terminal IN7 is connected to the first output terminal OUT1 through an inter-cell wiring 65 in a different wiring layer connected to vias 72 and 71. The input terminal IN8 of the decoupling capacitance cell A3 is connected to the second output terminal OUT2 through an inter-cell wiring 62. The input terminal IN7 of the decoupling capacitance cell A3' is connected to the first output terminal OUT1 of the TDDB control cell A1 through an inter-cell wiring 65 and the via 71. The input terminal IN8 of the decoupling capacitance cell A3' is connected to the second output terminal OUT2. The input terminal IN8 is connected to the second output terminal OUT2 through an inter-cell wiring 66 in a different wiring layer connected to via holes 74 and 73.

Because the decoupling capacitance cell A3 is arranged adjacently to the TDDB control cell A1, the wiring that connects the input terminal IN8 and the second output terminal OUT2 may be a metal wiring used in the cell.

By preparing the decoupling capacitance cell A3 having the aforementioned input terminals as a library, the decoupling capacitance cell A1 can supply power to the decoupling capacitance cell A3 that is provided in a distant position and protect the gate of the cell A3. As a result, one TDDB control cell A1 can be applied to the plurality of decoupling capacitance cells, which controls the increase of the chip area.

Figure 10:
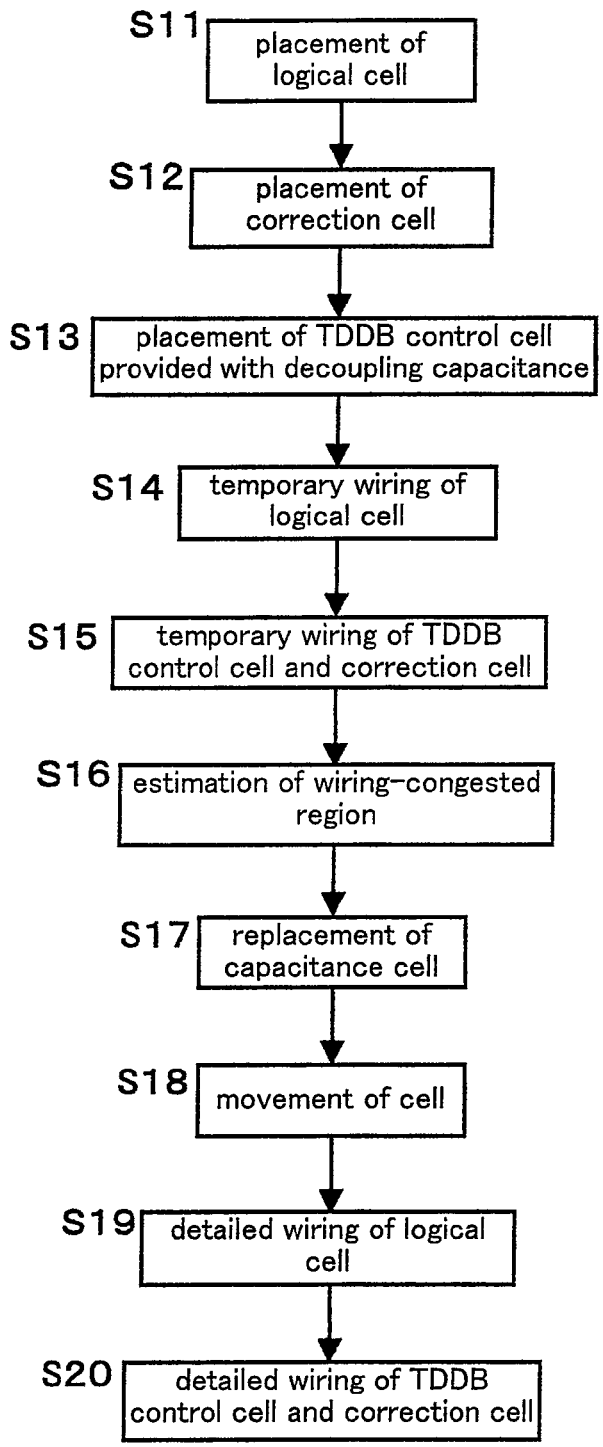
FIG. 10 is a flow chart illustrating steps of a method of designing the semiconductor integrated circuit according to the preferred embodiment 3.

Next, description is given to a designing method in relation to the layout and wiring of the decoupling capacitance cell A3 referring to a flow chart shown in FIG. 10. In Step S11, logical cells for realizing the function are arranged in a logical block. Next, a correction cell is arranged in Step S12. Then, in Step S13, the TDDB control circuit A1 provided with the decoupling capacitance is arranged in a blank region of the logical block, and the cell layout is completed.

Next, in Step S14, the logical cells arranged in Step 11 are temporarily wired in accordance with net information. Then, in Step S15, the TDDB control cell A1 and the correction cell are temporarily wired.

And then, in Step S16, a wiring-congested region is estimated from the result obtained in the Step S15. In Step S17, the TDDB control cell A1 arranged in a region without a wiring congestion is replaced with the decoupling capacitance cell A3 (A3') based on the result obtained in the Step S16. At the time, it is unnecessary to replace all of the TDDB control cells A1 in the region without a wiring congestion with the decoupling capacitance cells. A3 (A3'), and the TDDB control cell A1 may be retained by every few cells according to a standard previously set by a user. Because a new blank region is generated in the block through the Step S17, the cells arranged in the Steps S11-S13 are moved so that compaction of the blank region (automatic compaction) is implemented unless it does not violate a designing rule, in Step S18. After that, the details wirings are performed in Steps S19 and S20.

In the layout of the TDDB control cell in the designing methods described in the preferred embodiments 1, 2 and 3, the TDDB control cell. A1 provided with the decoupling capacitance and the TDDB control cell A2 provided with the correction circuit may be arranged in a mixed manner.

While the invention has been described in detail and with reference to preferred embodiments thereof, it will be understood that various modifications may be made therein, and it is intended to cover all such modifications in the appended claims as fall within the true spirit and scope of this invention.

What is claimed is:

1. A semiconductor integrated circuit comprising:
a TDDB control circuit; a first correction circuit; a second correction circuit; a first output terminal; a second output terminal; a first power supply wiring; and a second power supply wiring, wherein
the TDDB control circuit comprises a first transistor and a second transistor;
the first transistor and the second transistor are different in conductivity type thereof from each other, a source of the first transistor is connected to the first power supply wiring, and a drain of the first transistor is connected to a gate of the second transistor,
a source of the second transistor is connected to the second power supply wiring, and a drain of the second transistor is connected to a gate of the first transistor,
the second correction circuit is connected to at least one of the first output terminal and the second output terminal via an inter-cell wiring,
the first output terminal is connected to the drain of the first transistor, and
the second output terminal is connected to the drain of the second transistor and the first correction circuit.

2. The semiconductor integrated circuit as claimed in claim 1, wherein the TDDB control circuit and the first correction circuit compose a TDDB control cell.

3. The semiconductor integrated circuit as claimed in claim 1, wherein the second correction circuit composes a correction cell.

4. The semiconductor integrated circuit as claimed in claim 1, wherein the TDDB control circuit consists of the first transistor and the second transistor.

* * * * *